United States Patent
Bolle

(10) Patent No.: US 8,159,218 B2
(45) Date of Patent: Apr. 17, 2012

(54) MICROELECTROMECHANICAL MAGNETOMETER WITH INTEGRATED ELECTRONICS

(75) Inventor: Christian Bolle, Bridgewater, NJ (US)

(73) Assignee: Alcatel Lucent, Paris (FR)

( * ) Notice: Subject to any disclaimer, the term of this patent is extended or adjusted under 35 U.S.C. 154(b) by 855 days.

(21) Appl. No.: 12/185,193

(22) Filed: Aug. 4, 2008

(65) Prior Publication Data

US 2010/0026290 A1    Feb. 4, 2010

(51) Int. Cl.
    *G01R 33/02*    (2006.01)
(52) U.S. Cl. ........ 324/244; 324/259; 324/247; 324/249; 324/260; 29/607; 29/832; 29/854; 29/592.1
(58) Field of Classification Search ............. 324/244, 324/247, 249, 259, 260; 29/592.1, 607, 832, 29/852, 854
    See application file for complete search history.

(56) References Cited

U.S. PATENT DOCUMENTS

| | | | | |
|---|---|---|---|---|
| 5,942,895 A * | 8/1999 | Popovic et al. | ............ | 324/251 |
| 6,233,811 B1 * | 5/2001 | Payne et al. | ............ | 29/602.1 |
| 6,501,268 B1 * | 12/2002 | Edelstein et al. | ............ | 324/244 |
| 6,557,237 B1 * | 5/2003 | Olgado | ............ | 29/592.1 |
| 6,621,266 B1 * | 9/2003 | Payne et al. | ............ | 324/260 |
| 7,253,616 B2 * | 8/2007 | Bolle et al. | ............ | 324/244 |
| 7,394,245 B2 * | 7/2008 | Brunson et al. | ............ | 324/244 |
| 7,501,815 B2 * | 3/2009 | Brunson et al. | ............ | 324/244 |
| 7,757,385 B2 * | 7/2010 | Hembree | ............ | 29/748 |
| 7,830,142 B2 * | 11/2010 | Blumberg et al. | ............ | 324/244 |
| 7,932,727 B2 * | 4/2011 | Bolle et al. | ............ | 324/525 |
| 2005/0151540 A1 * | 7/2005 | Shi et al. | ............ | 324/318 |
| 2007/0001671 A1 * | 1/2007 | Park et al. | ............ | 324/244 |
| 2007/0030001 A1 * | 2/2007 | Brunson et al. | ............ | 324/253 |
| 2007/0085533 A1 * | 4/2007 | Bolle et al. | ............ | 324/244 |
| 2007/0096729 A1 * | 5/2007 | Brunson et al. | ............ | 324/244 |
| 2007/0257565 A1 * | 11/2007 | Urey et al. | ............ | 310/38 |
| 2007/0296410 A1 * | 12/2007 | Blumberg et al. | ............ | 324/244 |
| 2009/0146767 A1 * | 6/2009 | Zhu et al. | ............ | 335/302 |
| 2011/0081739 A1 * | 4/2011 | Cortese et al. | ............ | 438/49 |

* cited by examiner

*Primary Examiner* — Huy Q Phan
*Assistant Examiner* — Lamarr Brown
(74) *Attorney, Agent, or Firm* — Hitt Gaines, PC

(57) ABSTRACT

A method of manufacturing an apparatus 200 comprising forming an integrated magnetometer package 202. Forming an integrated magnetometer package 202 includes forming a movable part 215 from a MEM magnetometer substrate 210, and attaching an integrated circuit 910 to one side 212 of the MEM magnetometer substrate. A spacer structure 410 is formed on an opposite side of the MEM magnetometer substrate such that the moveable part is exposed through an opening 420 in the spacer structure. But the moveable part cannot escape through said opening. A permanent magnet 1010 is mounted through the opening to the movable part.

20 Claims, 13 Drawing Sheets

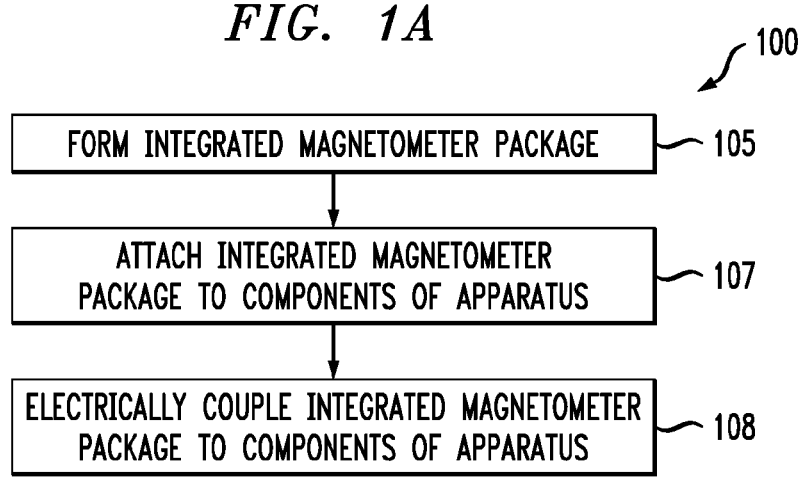
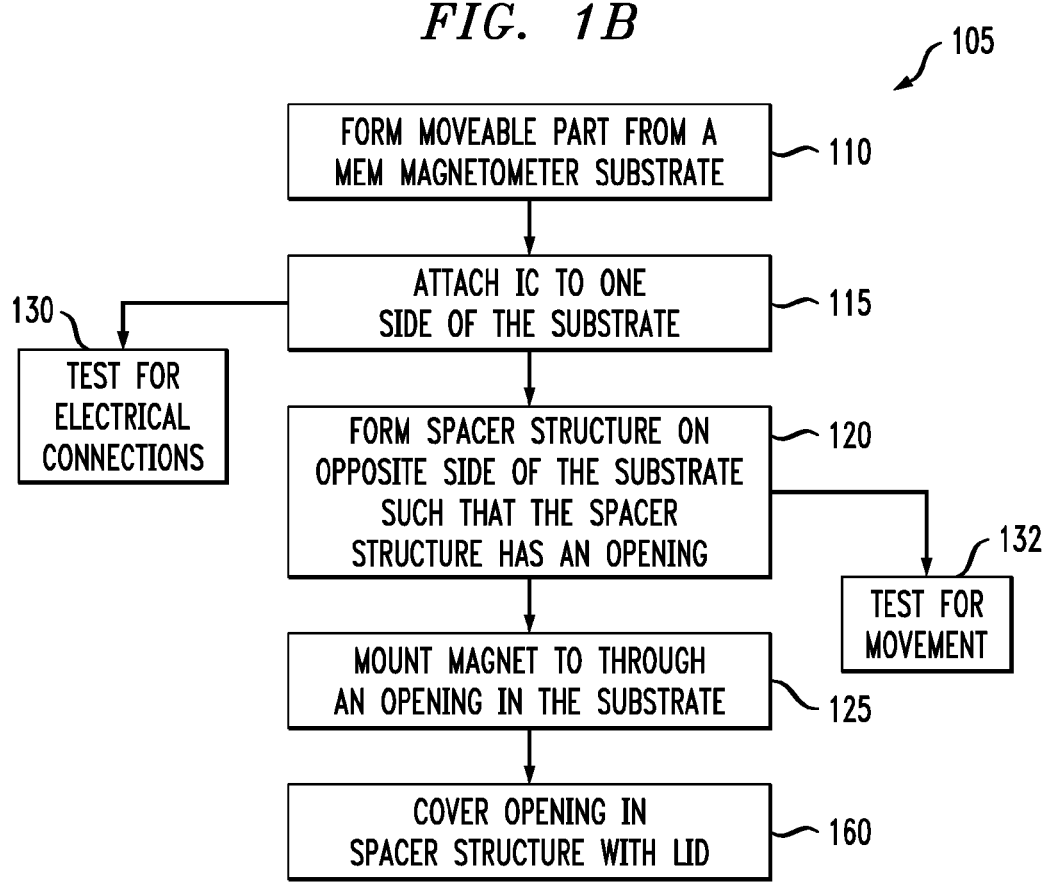

MICROELECTROMECHANICAL MAGNETOMETER WITH INTEGRATED ELECTRONICS

TECHNICAL FIELD OF THE INVENTION

The present invention relates, in general, to apparatuses for measuring magnetic fields, as well as methods of using and manufacturing such apparatuses.

BACKGROUND OF THE INVENTION

The measurement of magnetic fields has many applications, such as navigation, metal detection in security settings, and oil and mineral prospecting. There is a long-standing need for a sensitive but compact, inexpensive and low-power consuming apparatus to detect small changes in magnetic fields over large ranges. Microelectromechanical (MEM) magnetometers are often composed of several parts that are fabricated and assembled, and then connected to a separately-manufactured integrated circuit.

SUMMARY

One embodiment of the present disclosure is a method of manufacturing an apparatus. The method comprises forming an integrated magnetometer package. Forming the integrated magnetometer package includes forming a movable part from a MEM magnetometer substrate, and attaching an integrated circuit to one side of the MEM magnetometer substrate. Forming the package also includes forming a spacer structure on an opposite side of the MEM magnetometer substrate such that the moveable part is exposed through an opening in the spacer structure but the moveable part cannot escape through the opening. Forming the package further includes mounting a permanent magnet through the opening to the movable part.

Another embodiment is an apparatus that comprises an integrated magnetometer package. The package includes a MEM magnetometer substrate having a movable part, and an integrated circuit attached to one side of the MEM magnetometer substrate. The package also includes a spacer structure on an opposite side of the MEM magnetometer substrate such that the moveable part is exposed through an opening in the spacer structure but the moveable part cannot escape through the opening. The package further includes a permanent magnet mounted to the movable part on the opposite side of the MEM magnetometer substrate.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which:

FIGS. 1A-1C present a flow diagrams of selected steps in example methods of manufacturing apparatuses of the disclosure.

DETAILED DESCRIPTION

Embodiments of the present disclosure integrate the manufacture of a MEM magnetometer and an integrated circuit in a single process flow to form an integrated magnetometer package. In particular, certain steps in the manufacture of the MEM magnetometer are not completed until after the integrated circuit and a spacer structure are attached to the partially-constructed MEM magnetometer. This is in contrast to completely and separately manufacturing the MEM magnetometer and the integrated circuit, and then connecting the completely-constructed integrated circuit to the completely-constructed MEM magnetometer.

Figure 1C:
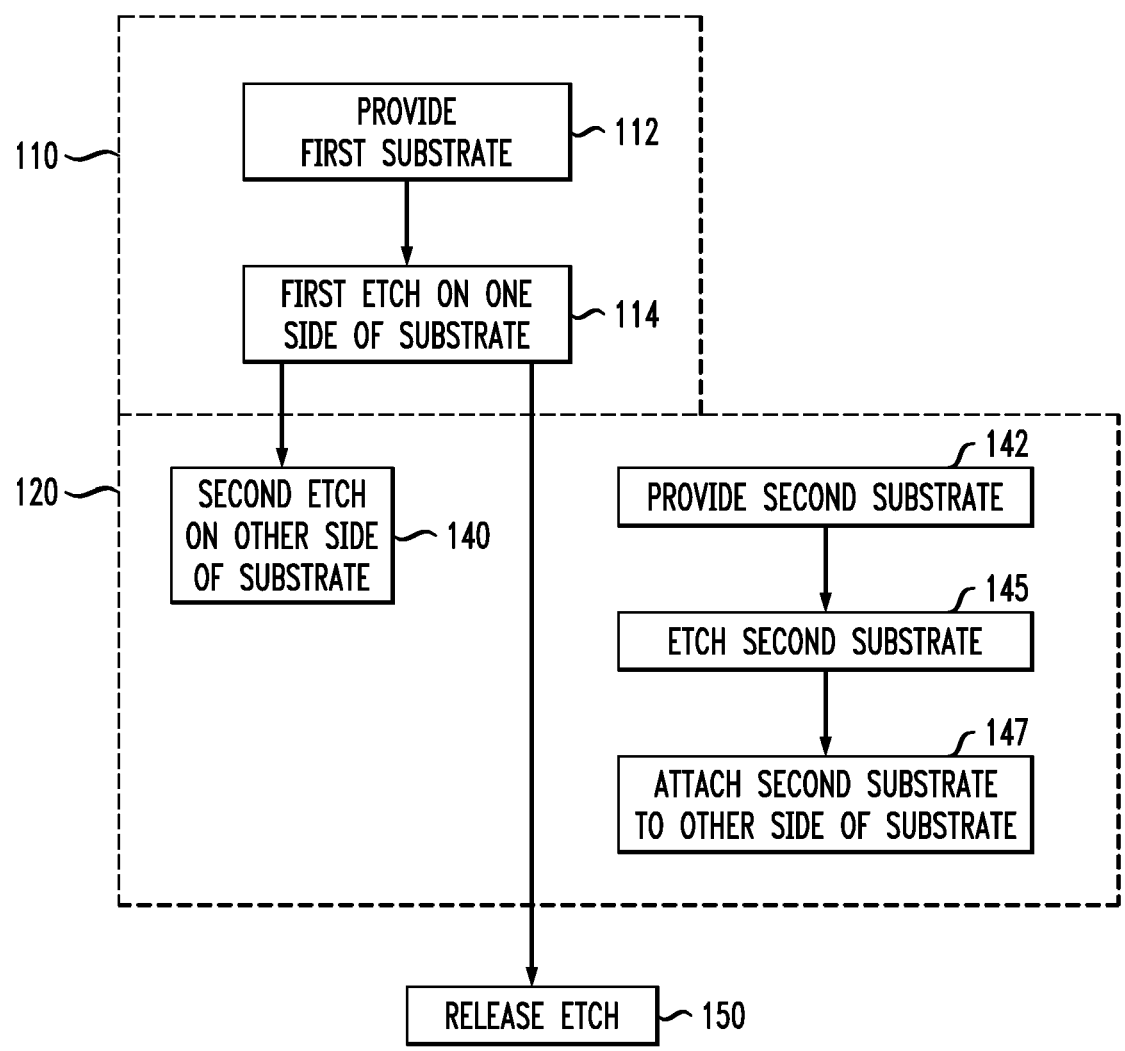

One embodiment of the disclosure is a method of manufacturing an apparatus. FIGS. 1A-1C present flow diagrams of selected steps in an example method 100 of manufacturing an apparatus. As shown in FIG. 1A, the method 100 includes a step 105 of forming an integrated magnetometer package. Embodiments of the method 100 can further include a step 107 of attaching the package formed in step 105 to the components of the apparatus, and, electrically coupling the package to components of the apparatus in step 108.

Such steps may include, for example, attaching and electrically coupling the magnetometer package in accordance with steps 107 and 108 (FIG. 1A) to components of the apparatus, such as: a power supply for the package (e.g., a battery), a visual and/or auditory display of the magnetic field strength or other information measured by the package, a transmitter that sends such information to remote receiver location, or, a receiver that controls the operation of the package based on instructions received from a remote location. One of ordinary skill in the art would be familiar with other steps in the method that may be used to complete the manufacture of the apparatus.

As shown in FIG. 1B, forming the package (step 105) includes a step 110 of forming a movable part from a substrate of a MEM magnetometer, referred to herein as a MEM magnetometer substrate. Forming the package (step 105) also includes a step 115 of attaching an integrated circuit (IC) to one side of the substrate. Forming the package (step 105) further includes a step 120 of forming a spacer structure on an opposite side of the substrate. The spacer structure is formed such that the moveable part is exposed through an opening in the spacer structure but the moveable part cannot escape through the opening.

The term movable part as used herein refers to the components of the fully-manufactured MEM magnetometer that are capable of moving, relative to other non-moving components of the MEM magnetometer substrate, in response to an external magnetic field in the vicinity of the apparatus. The movement can be part of the normal operation of the magnetometer package, or, due to the close proximity of a magnetic object to the package. The term movable part as used herein can refer to the unreleased part after being patterned but before being released from the substrate, e.g., by a release etch, or, to the part after being released from other parts of the substrate.

Forming the package (step 105) further includes a step 125 of mounting the magnet through said opening to said movable part. Thus the magnet is mounted to the opposite side of the MEM magnetometer substrate as the side that the integrated circuit is mounted to. Attaching the integrated circuit to one side of the substrate in step 115 can obstruct access to the moveable part to which the magnet will ultimately gets mounted to in step 125. The method of the present disclosure overcomes this obstacle by providing a spacer structure on the opposite side of the substrate and providing the spacer structure with an opening through which the magnet can be mounted.

The magnet is mounted in step 125, after the integrated circuit is attached to one side (step 115) and after the spacer structure is formed on an opposite side of the substrate (step 120). Mounting the magnet to the moveable part after these two steps 115, 120 provides advantages not present in alternative processes where the magnet is mounted to a movable part of the MEM magnetometer before these steps 115, 120. When the magnet is mounted before these steps 115, 120, the magnet and movable part can be undesirably moved or damaged by attractive magnetic forces between the magnet and assembly tools (e.g., micromanipulators use to perform steps 115, 120 or subsequent steps), or, between the magnet and the integrated circuit. Although such undesired effects may be mitigated by using non-magnetic electrical circuits or assemble tools, it is very difficult to entirely avoid the use of magnetically sensitive assembly tools or integrated circuit. In the present method 100, a magnetically sensitive integrated circuit or magnetic assembly tools can be contacted to, or brought in the vicinity of, the MEM magnetometer substrate for several steps (e.g., steps 115, 120) without damaging the MEM magnetometer's parts, because the magnet is mounted to the moveable part at a later step 125 in the method 100.

Another advantage in mounting the magnet at a later step 125 in the method 100, is that moveable and other parts of the partially constructed MEM magnetometer can be tested for their proper electrical connection (step 130, FIG. 1B) to the integrated circuit, and, tested for their ability to move properly (step 132, FIG. 1B), without interfering effects from the magnet.

As shown in FIG. 1C, in some embodiments, forming the moveable part in step 110 can include providing a first substrate (e.g., a MEM magnetometer substrate) in step 112, and, performing a first etch (step 114) on a first side of the substrate. The first etch (step 114) can form both moveable and non-moving parts of the MEM magnetometer.

As further shown in FIG. 1C, in some embodiments, forming the spacer structure in step 120 includes performing a second etch (step 140) of a second side the same substrate (e.g., the MEM magnetometer substrate) to form the opening and other part of the spacer structure. In some cases, as part of the second etch to form the spacer structure (step 140), the moveable part is released from non-moving parts of the substrate. For instance, as part of forming the spacer structure, one or more layers of the substrate are removed from a second side of the substrate thereby releasing the moveable part from non-moving portions of the substrate.

As also shown in FIG. 1C, in alternative embodiments, the second etch on the second side of the substrate in step 140, may not be used to form the spacer structure. However, the second etch step 140 can still be performed to release the moveable part similar to that described above. Instead, forming the spacer structure in step 120 can include providing a second substrate (step 142), etching the second substrate (step 145) to form the spacer structure, and attaching (step 147) the spacer structure to the second side of the MEM magnetometer substrate.

In some embodiments, the first side of the MEM magnetometer substrate can correspond to the one side that the integrated circuit is attached to, and, the second side of the substrate can correspond to the opposite side that the spacer structure is formed on. In other embodiments, the second side can correspond to the one side that the integrated circuit is attached to, and, the first side can correspond to the opposite side that the spacer structure is formed on.

In some embodiments, stop-structures are manufactured as part of attaching the integrated circuit (step 115) and forming the spacer structure (step 120). The stop-structures help to prevent excessive out-of-plane movement of the moveable part during the manufacture or during the operation of the MEM magnetometer.

For instance, attaching the integrated circuit to the one side of the MEM magnetometer (step 115) can includes forming a bonding structure between the integrated circuit and the one side. The bonding structure defines a gap between the one side of the MEM magnetometer substrate and an opposing surface of the integrated circuit. To mitigate excessive movement of the moveable part, it is advantageous for this gap to be less than the thickness of the moveable part.

For instance, forming the spacer structure (step 120) can include forming support structures that are configured to contact the opposite side of the MEM magnetometer substrate (e.g., the side opposite to the one side that the integrated circuit is attached to). In some cases, the support structures can be formed as part of the second etch step 140 or the second substrate etch step 145. Or, separately formed support structures can be coupled to the second side of the substrate, or, to the second substrate. The support structures can define a gap between the opposite side of the moveable part and an opposing surface of the support structure. Again, to mitigate excessive movement of the moveable part, it is advantageous for this gap to be less than the thickness of the moveable part.

As illustrated in FIG. 1C, some embodiments of forming the moveable part (step 110) can further include a separate release etch step 150. The release etch step 150 may not be not part of the etch step 140 to form the support structure. For instance, when the MEM magnetometer substrate is a silicon-on-insulator (SOI) substrate, an oxide layer can be used as an etch stop layer for the first etch 114. It can be advantageous to keep the oxide layer intact until after both the spacer structure is formed (step 120), and the integrated circuit attached (step 115) to the substrate so that the moveable part is held in its proper location via its attachment to the oxide layer. The oxide layer can then be removed using conventional procedures (e.g., exposure to hydrofluoric acid) to release the moveable part from non-moveable portions of the MEM magnetometer substrate. In other cases, however, the release etch can be performed as part of the second etch (step 140).

As illustrated in FIG. 1B, after the magnet is mounted in step 125, some embodiments of the method can further include a step 160 of covering the opening of the spacer structure with a lid. The lid helps to prevent particles from contacting the moveable part and can work in cooperation with other structures (e.g., the support structures formed as part of in step 120 or the bonding structures formed as part of step 115) to seal-off the moveable part of the MEM magnetometer from the external environment. Sealing off the moveable part of the MEM magnetometer can advantageously prevent particles or corrosive atmospheres from contacting the moveable part and thereby rendering the apparatus inoperable.

With continuing reference to FIGS. 1A-1C, to further illustrate various aspects of the method 100, FIGS. 2-12 present plan and cross-section views of an example apparatus 200 at selected stages of manufacture, to illustrate the manufacture of an example integrated magnetometer package 202 in accordance with step 105.

Figure 2:
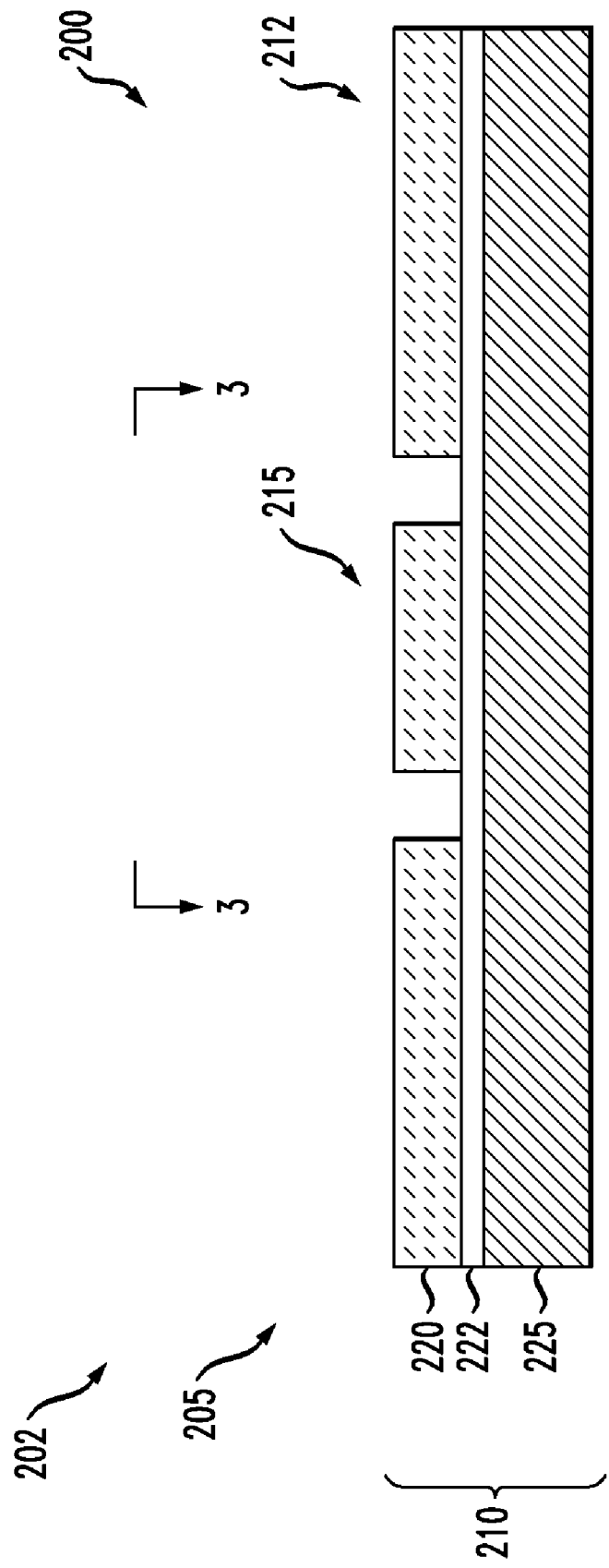
FIGS. 2-12 present cross-sectional and plan views of an example embodiment of apparatuses at different stages of manufacture, for example, in accordance with the method steps presented in FIGS. 1A-1C.

FIG. 2 illustrates a cross-sectional view of the partially-constructed apparatus 200 that includes a MEM magnetometer 205. The cross-sectional views shown in FIG. 2 corresponds simplified view, along view line 2-2, of the example apparatus 200 shown in FIG. 3.

Any of the procedures for forming MEM magnetometers described in U.S. Pat. No. 7,253,616 to Bolle et al. ("Bolle"), which is incorporated by reference in its entirety, can be used to form the MEM magnetometer.

FIG. 2 shows the apparatus after forming a moveable part 215 from a substrate 210 (e.g., a MEM magnetometer substrate) in accordance with step 110 (FIG. 1B). For instance, the etching procedures such as described in Bolle can be used to perform the first and second etching steps 114, 140 of the substrate 210. For example, the photolithographic and etching procedures such as described in Bolle, can be used to pattern a substrate 210, such as a SOI substrate provided in step 112, so as to define components of the MEM magnetometer 205 using the first etching step 114. A first etch (e.g., a deep ion etch process) can be performed in accordance with step 114 on a first side 212 (e.g., the one side) of the substrate 210 to form a moveable part 215 and/or non-moving parts of the MEM magnetometer 205. For the embodiment shown in FIG. 2, the MEM magnetometer 205 can be formed by etching a thin silicon layer 220 (e.g., about 30 to 50 micron thick) of a SOI substrate 210, using a middle oxide layer 222 (e.g., about 1 to 2 microns thick) of the SOI substrate 210 as an etch stop layer. In the illustrated embodiment, the underlying thick silicon layer 225 (e.g., about 400 to 500 microns thick) is not etched by the first etch.

Figure 3:
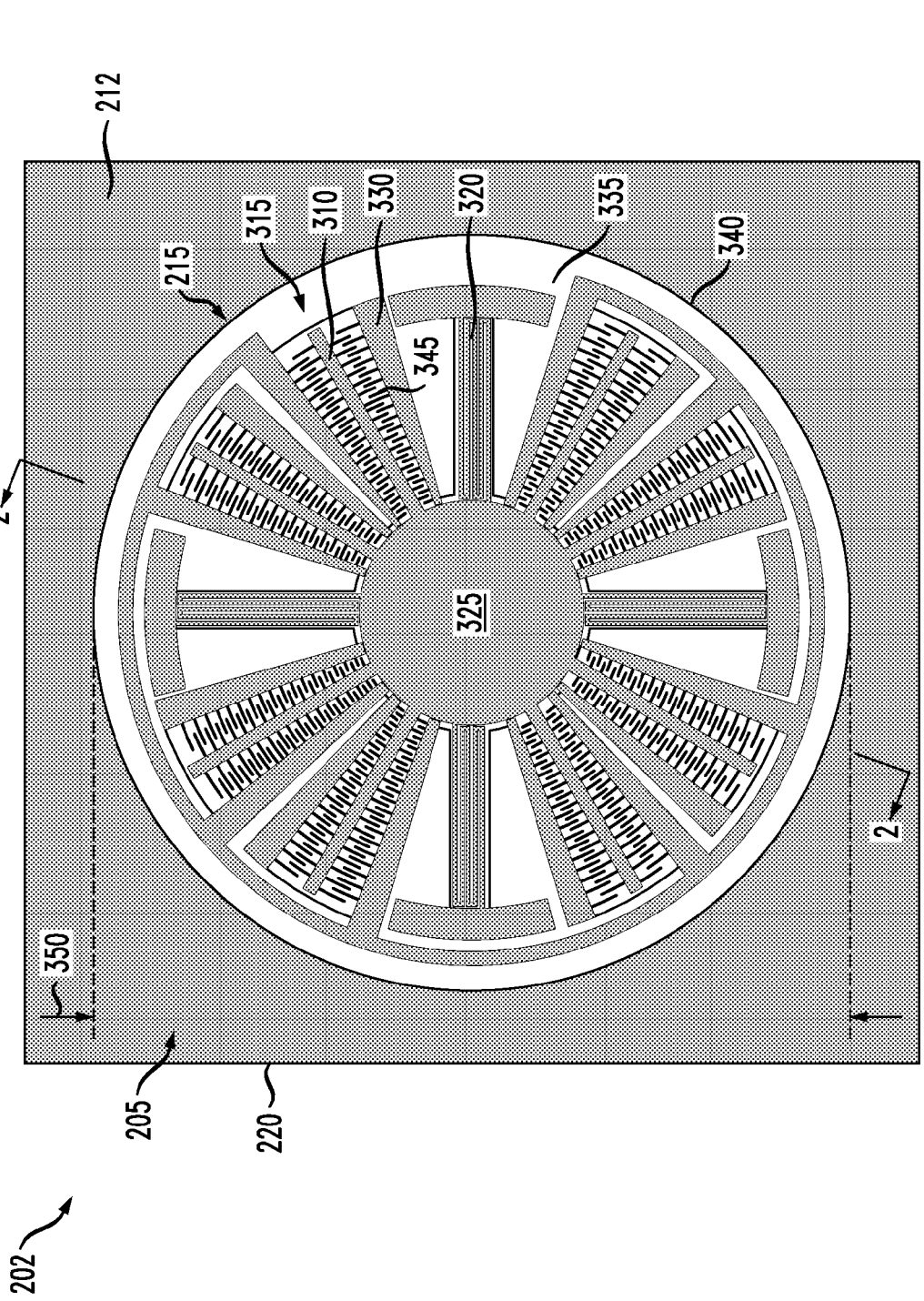

FIG. 3 shows a plan view of the MEM magnetometer 205 at the same stage of manufacture as shown in FIG. 2. The plan view in FIG. 3 corresponds to view line 3-3 in FIG. 2. The moveable part 215 can include a moveable electrode arm 310 of a comb capacitor 315, a spring 320 and a central hub 325, the arm 310 and spring 320 being physically connected to the hub 325. Non-moving parts of the MEM magnetometer 205 can include a fixed electrode 330 of the capacitor 315, remaining portions of the substrate 210 (e.g., portions of the thin layer 220), and walls 335 of substrate 210 that define an opening 340 in the substrate 210 (e.g., the opening 340 in the thin layer 220 that the moving part 210 is located in). The MEM magnetometer 205 can include any of the embodiments apparent from the discussion of the MEM devices presented in Bolle. For example, embodiments of the capacitor 315 can include interdigitated fingers 345. Embodiments of the moveable part 215 of the MEM magnetometer 205 can be a substantially planar and circularly-shaped structure located in the plane of the substrate 210 (e.g., in the plane of the thin layer 215), and have an outer diameter 350 in the range of about 1 to 2 millimeters.

Figure 4:
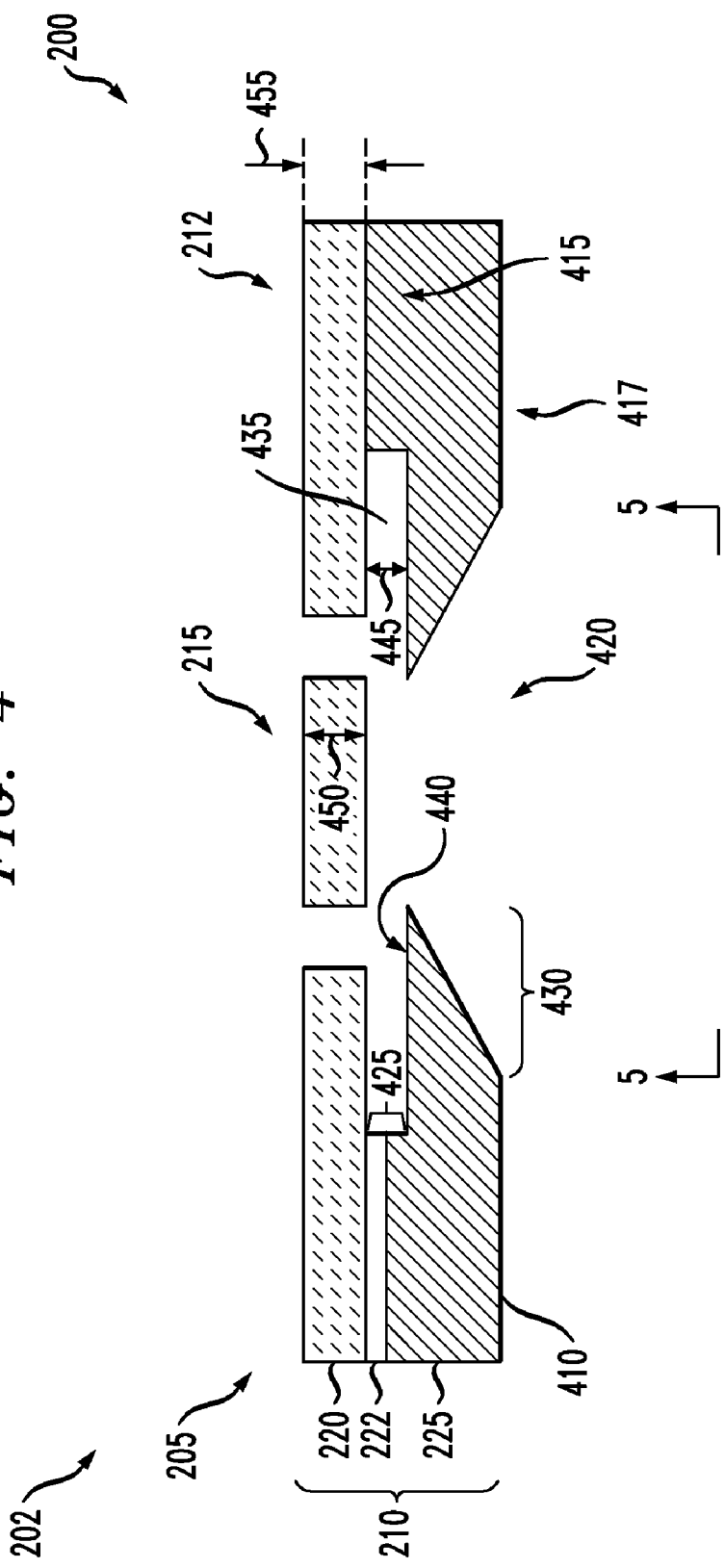

FIG. 4 illustrates a cross-sectional view, analogous to that shown in FIG. 2, of the partially-constructed apparatus 200 after forming a spacer structure 410 on an opposite side 415 of the MEM magnetometer substrate 210 in accordance with step 120 (FIG. 1B). For the embodiment shown in FIG. 4, forming the spacer structure 410 can include a second etch (step 140, FIG. 1C) of a second side 417 of the substrate 210 (e.g., the thick layer 225).

In some cases, the second etching step 140 includes forming an opening 420 in the spacer structure 410 by vertical etching and undercut-lateral etching of the substrate 210 using, e.g., a Single Crystal Reactive Etching and Metallization (SCREAM) or other similar processes well known to those skilled in the art. In some cases, support structures 425 are formed as part of the second etching step 140 (FIG. 1). The support structures 425 can contact the opposite side 415 of the MEM magnetometer 205. In some cases when the substrate 210 is a SOI substrate, the support structures 425 can include portions of the middle oxide layer 222 and thick layer 225.

In some cases, the spacer structure 410 can also include a ledge 430 formed as part of the second etching step 140. As shown in FIG. 4, the ledge 430 can extend over, but not touch, the moveable part 210. The ledge 430, can serve as a stop-structure, by helping to keep the moveable part 210 from being excessively dislocated from its in-plane position during the apparatus's 200 manufacture, testing or operation. As shown the ledge 430 can be beveled so as to help guide the magnet towards the moveable part 215 when it is placed through the opening 420 and attached to the moveable part 215 later-on in the process.

The support structures 425 define a gap 435 between the opposite side 415 of the moveable part 215 and an opposing surface 440 of the support structure 425. It is desirable for the gap 435 to be sufficiently small to prevent excessive movement of the moveable part 215 but still allow some movement as part of the normal operation of the apparatus 200. For example, it is advantageous for the gap 435 to have a width 445 that is less than the thickness 450 of the moveable part 215. In some preferred embodiments, the gap width 445 is in a range of about 25 to 75 percent of the thickness 450 of the moveable part. Consider an embodiment where the moveable part has a thickness 450 that is substantially equal to a thickness 455 of the thin layer 220 (e.g., about 40 microns). The gap width 445 can have a value in the range of about 10 to 30 microns. In some cases, to further avoid damage to the moveable part 215, the gap width 445 can be adjusted to allow the moveable part 215 to displace up to 2 microns out-of-plane from the non-moving parts of the MEM magnetometer 205.

Figure 5:
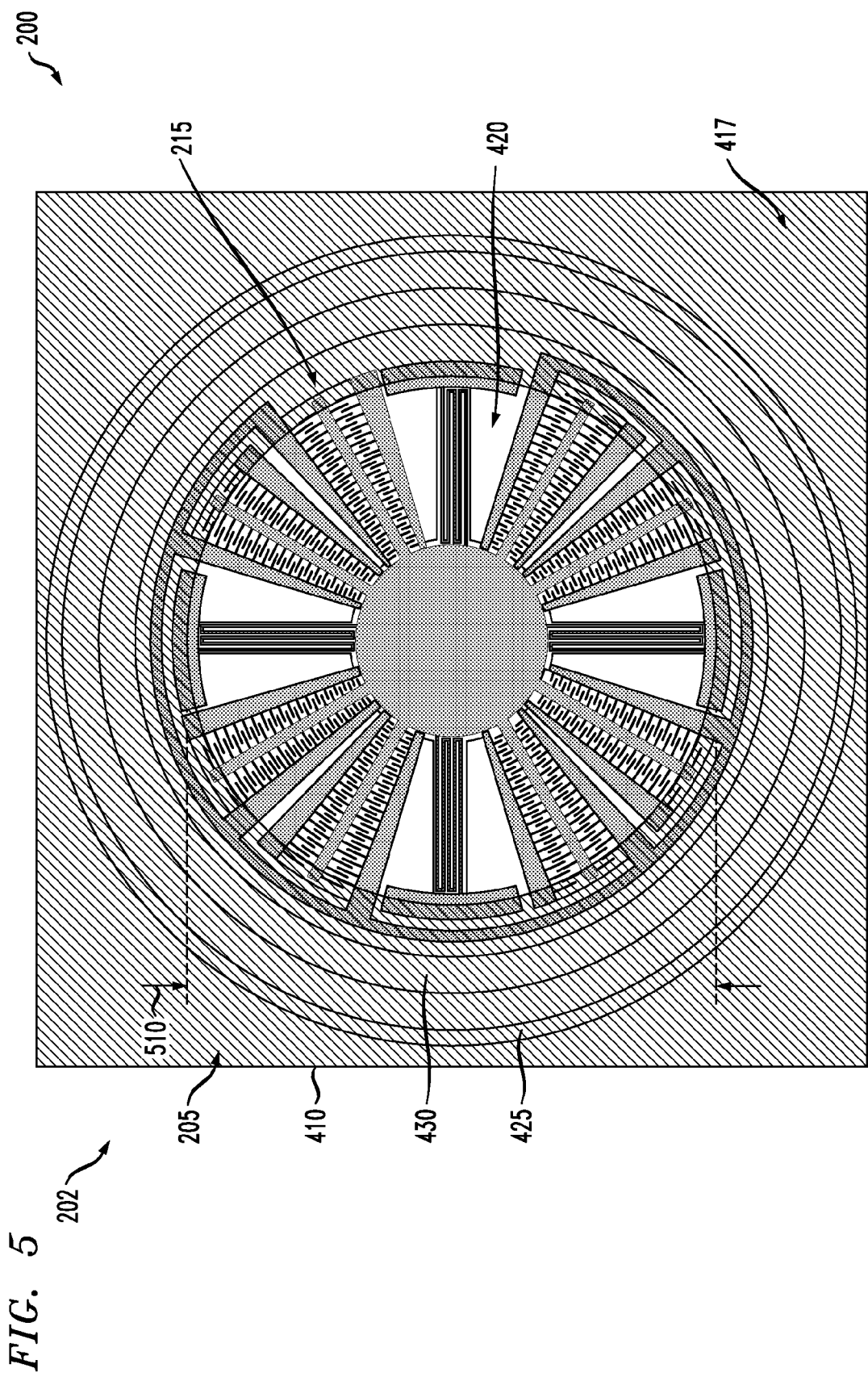

FIG. 5 shows a plan view of the MEM magnetometer 205 at the same stage of manufacture as shown in FIG. 4. The plan view in FIG. 5 corresponds to view line 5-5 in FIG. 4. The spacer structure 410 is depicted transparently so that underlying structures are visible.

In some embodiments of the MEM magnetometer 205, the support structures 425 of the spacer structure 410 forms a single continuous structure on the substrate 210 that surrounds the moveable part 215 and thereby helps to seal-off the moveable part 215 from the external environment. The shape and dimension of the opening 420 can be important to preventing the moveable part from moving more than permitted by the gap width 445 (FIG. 4). For instance, the opening 420 of the spacer structure 410 can be a circular opening having a horizontal diameter 510 that is less than an outer diameter 350 of the moveable part 215 (FIG. 3).

Figure 6:
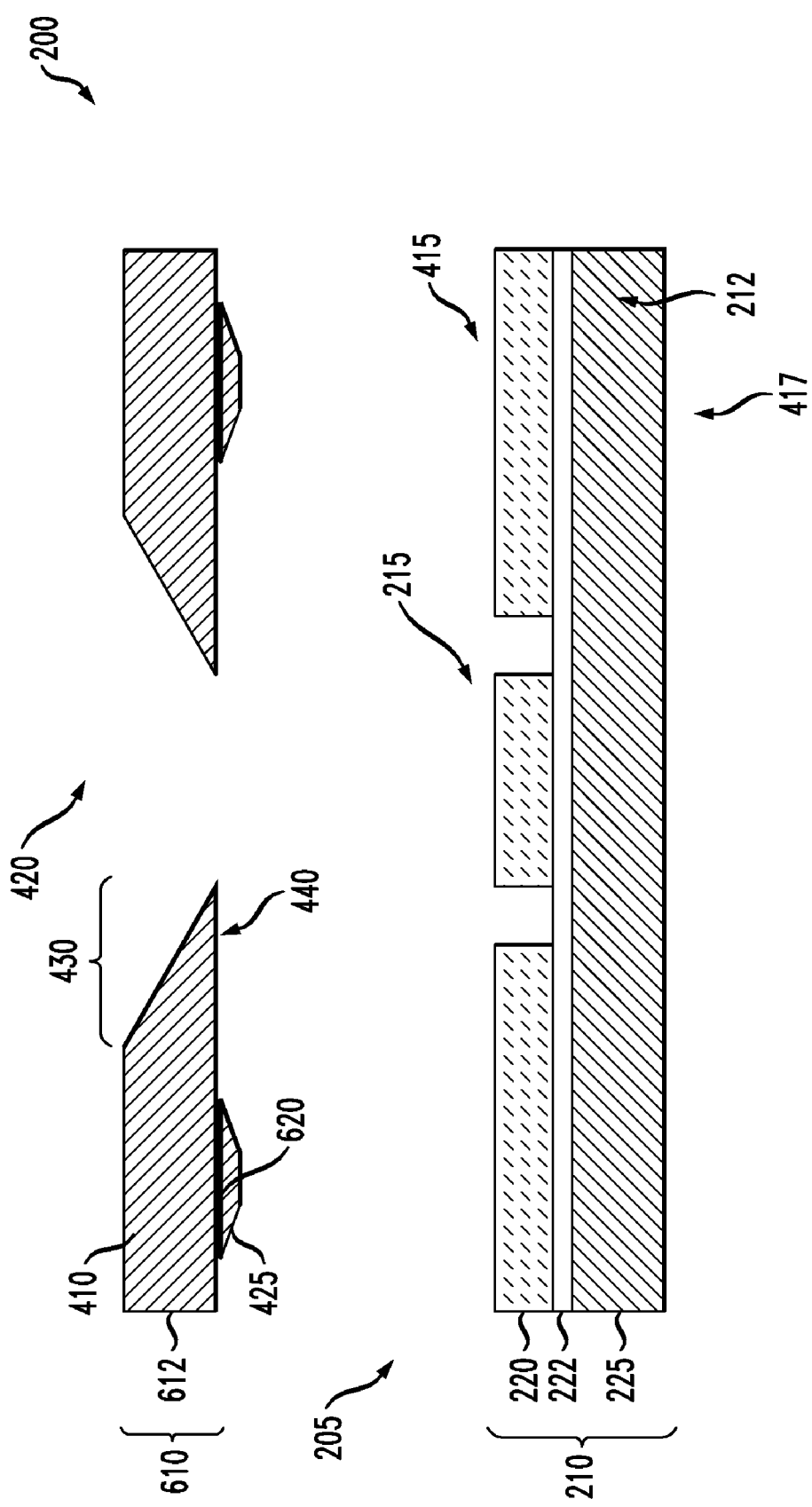
Figure 7:
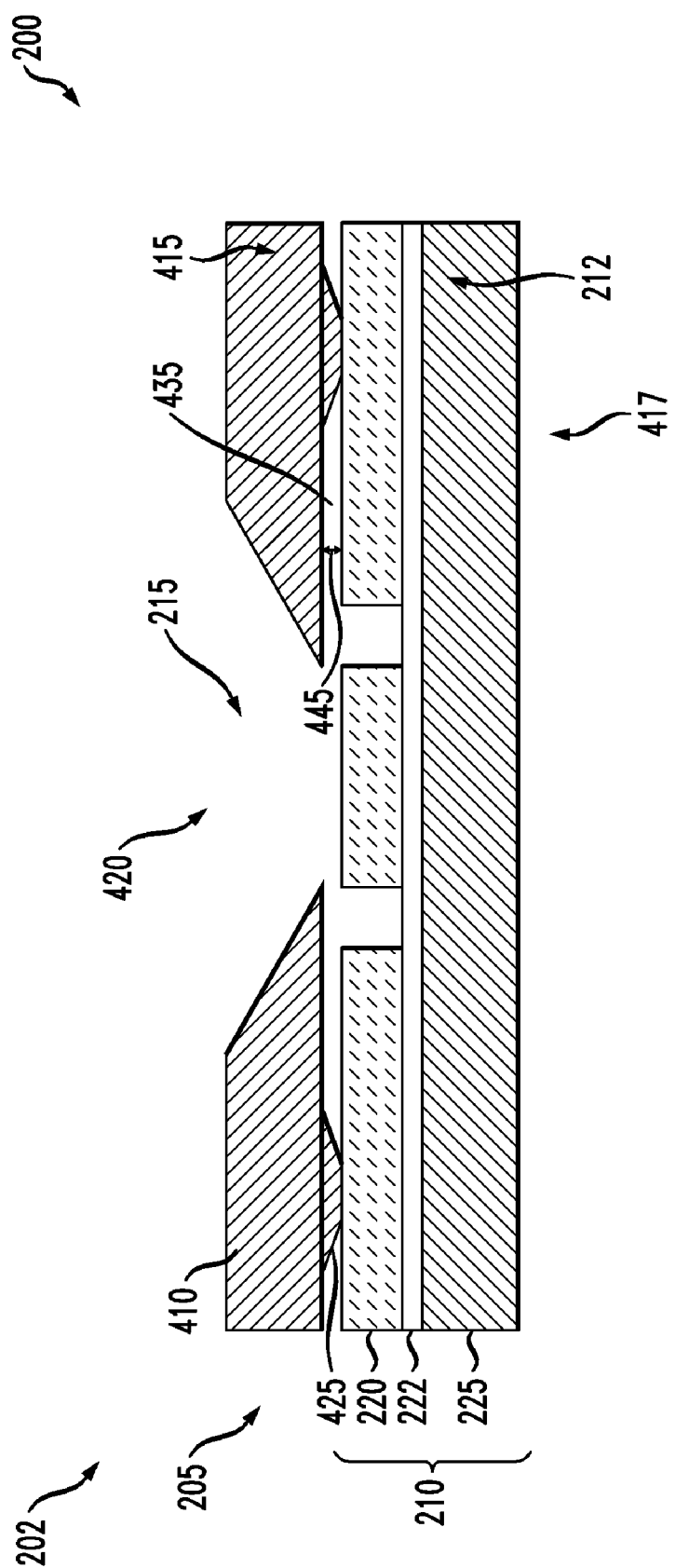
Figure 8:
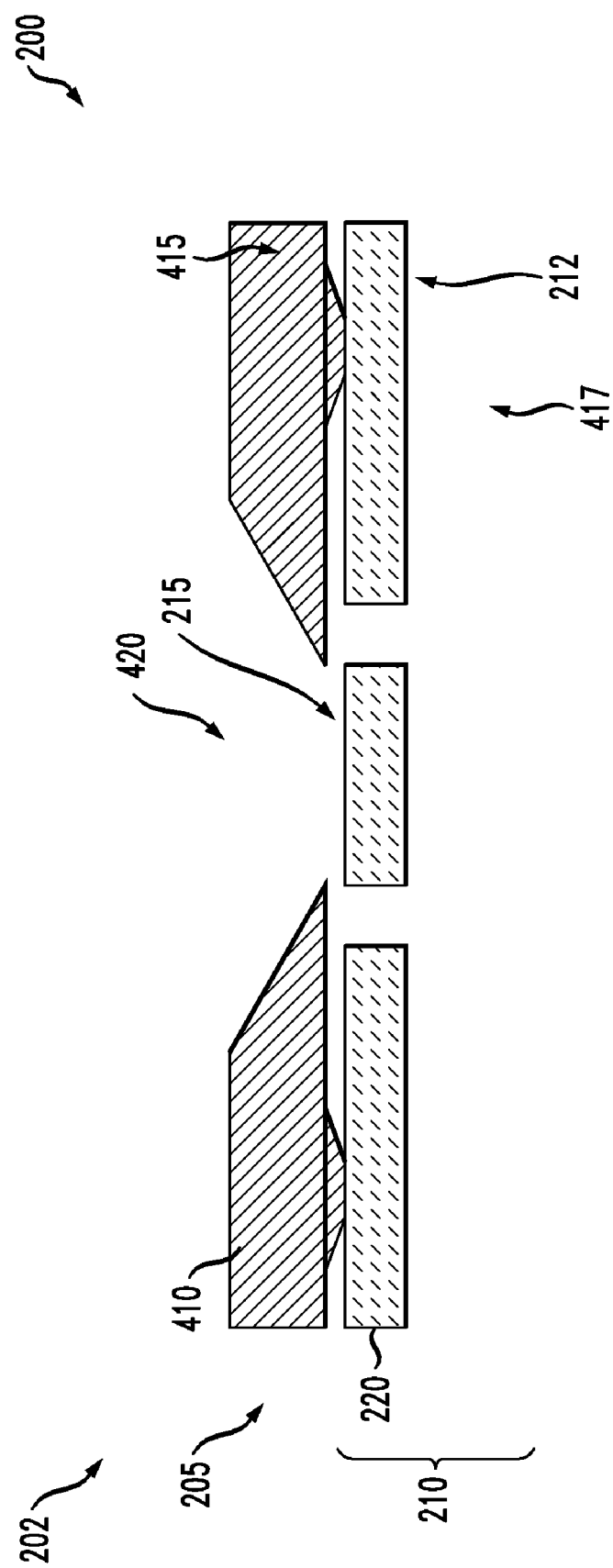

FIGS. 6-8 present cross-sectional views, analogous to that shown in FIGS. 2 and 4, of a partially-constructed example apparatus 200 after performing an alternative embodiment of step 120 to form the spacer structure 410 on the MEM magnetometer 205. For clarity, similar structures are depicted using the same reference numbers as presented in FIGS. 2-4.

FIG. 6 shows the apparatus 200 after performing the first etching step 114 (FIG. 1) on a first side 415 (e.g., the opposite side to which the integrated circuit will be attached) of the substrate 210 to form the moveable part 215 and non-moving parts of the MEM magnetometer 205. The same procedures as described above in the context of FIGS. 2-3 can be performed to perform the first etch step 114.

FIG. 6 also shows a second substrate 610 after being etched (step 145) to form the spacer structure 410. In some cases a thick layer 612 of the second SOI substrate 610 can be etched using similar procedures as described above in the context of FIGS. 3-4, to form the spacer structure 410 and its component parts, including e.g., the opening 420, support structures 425 and ledge 430. If desired, a different type of material than used to form MEM magnetometer 205 can be used to form the spacer structure 410. However, in other cases, the same type of material is used to form the spacer structure 410 as used to form the MEM magnetometer 205.

In some cases, the support structures 425 are formed as part of etching the second substrate 610 in step 140 (FIG. 1) to form the spacer structure 410. In other cases, the support structures 425 are separately constructed and then attached to the spacer structure 410 after etching the second substrate 610 to form the spacer structure 410. For instance, the support structures 425 can be formed by etching silicon or other materials, and then the support structure 425 is glued or otherwise bonded or coupled to a surface 440 of the spacer structure 410. In some cases, the support structure 425 can be composed of solder (e.g., solder bumps) which is bonded to the surface 440. In some cases, to facilitate solder bonding, the surface 440 can be on a landing pad 620 comprising a thin layer of metal (e.g., an under bump metallization landing pad).

FIG. 7 shows the apparatus 200 after attaching the spacer structure 410 (FIG. 6) to the first side 415 of the substrate 210 in accordance with step 147. The spacer structure 410 is preferably attached to the first side 415 via the support structures 425 so that a gap 435 defined between the first side 212 and the opposing surface 440 (FIG. 6) of the spacer structure 410. For instance, silicon support structures 425 can be glued to the first side 415, or, solder support structures 425 can be bonded to the first side 415. The spacer structure 410 can be configured so as to provide the gap 435 with the desired width 445 as discussed above in the context FIG. 4. Similar to that discussed in the context of FIG. 5 above, the spacer 410 depicted in this embodiment can form a single continuous structure on the MEM magnetometer 205 that surrounds the moveable part 215 and thereby helps to seal off the moveable part 215 from the external environment.

FIG. 8 shows the apparatus 200 after performing a second etch (e.g., as part of step 140 or step 150, FIG. 1C) to remove one or more layers (e.g., thick layer 225 and middle oxide layer 222) from a second side 417 of the substrate 210. The second etch can thereby expose the one side 212 of the MEM magnetometer 212 to which the integrated circuit will be attached.

The resulting partially-constructed example apparatus 200 embodiment depicted in FIG. 8 has substantially the same features as the partially-constructed example apparatus 200 depicted in FIG. 4. Consequently, either of these partially-constructed example apparatuses 200 could be further processed as described in FIGS. 1A-1C. For simplicity, however, the subsequent method steps are depicted in FIGS. 9-12 in the context of using the partially-constructed example apparatus 200 depicted in FIG. 4.

Figure 9:
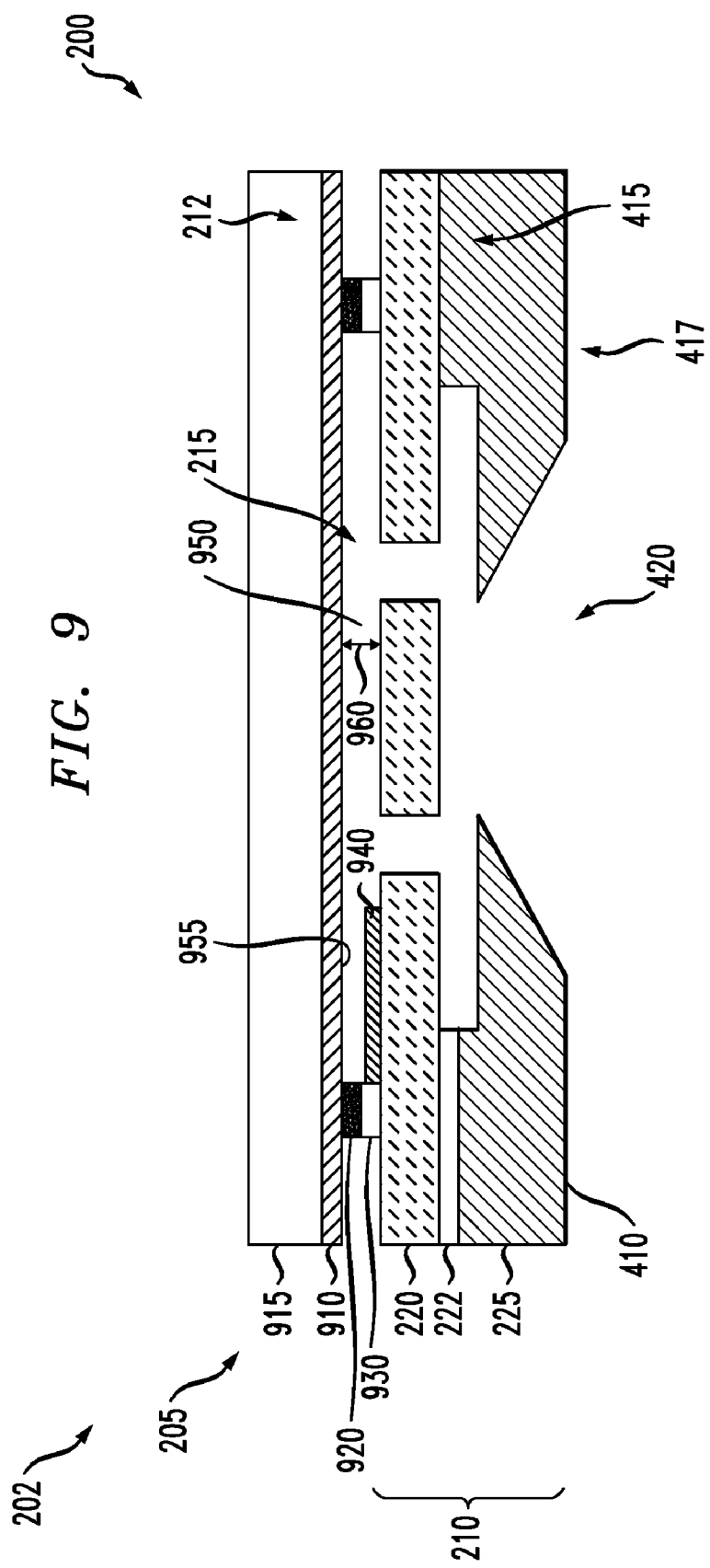

FIG. 9 illustrates a cross-sectional view, analogous to that shown in FIG. 4, of the partially-constructed apparatus 200 after attaching an integrated circuit 910 to one side 212 of the MEM magnetometer 205 in accordance with step 115 (FIG. 1B). One of ordinary skill in the art would be familiar with conventional procedures to fabricate the integrated circuit 910 on a wafer substrate 915. In some embodiments, attaching the integrated circuit 910 (step 115) includes forming a bonding structure 920 between the integrated circuit 910 and the one side 212. In some cases, to facilitate attachment, the bonding structure 920 can be one or more solder bonds. For example, a flip-chip bonding process can be used to bond solder from the integrate circuit 910 to landing pads 930 on the MEM magnetometer 205. However, those skilled in the art would be familiar with other integrated circuit attachment techniques that could be used.

The integrated circuit 910 can have circuitry configured to sense the movement (e.g., by measuring a change in the capacitance of the comb capacitor), or sense tension, on the moveable part 215 in response to an external magnetic field. The integrated circuit 910 can have circuitry configured to control a drive current that is sent to the MEM device (e.g., to oppose the tension on the moveable part 215). The integrated circuit 910 can also have amplifier circuitry, read-out circuit, test circuitry, or other circuitry components well-known to those skilled in the art, to facilitate the operation of the apparatus 200.

Attaching the integrated circuit 910 in step 115 (FIG. 1B) can further include forming electrical connections between the integrated circuit 910 and various components of the MEM magnetometer 205. The various circuitry components of the integrated circuit 910 can be coupled to the appropriate parts of the MEM magnetometer 205 (e.g., the moveable electrode 310 and fixed electrode 330 of the comb capacitors 315 depicted in FIG. 3) to control the apparatus. For instance, at least some of the bonding structure 920 (e.g., solder bumps or other interconnection structures) can provide an electrical connection between the MEM magnetometer 205 and the integrated circuit 910 when the integrated circuit 910 is attached to the one side 212. For example, metal lines 940 can be coupled to one or more landing pads 930 on the one side 212 of the MEM magnetometer 205 to facilitate the electrical connections.

Similar to some embodiments of the spacer structure 410, it can also be desirable for some embodiments of the integrated circuit 910 to provide a physical stop to prevent excessive movement of the moving part 215. The bonding structure 920 can define a second gap 950 between said one side and an opposing surface 955 of said integrated circuit. For example, when the integrated circuit 910 is flip chip bonded to the MEM magnetometer 205, solder bonds 920 can be made sufficiently tall (e.g., about 10 to 30 microns in some embodiments) to form the second gap 950 between the electronics circuit and the surface MEM magnetometer. In some preferred embodiments, the second gap 950 is sufficiently large to permit the normal range of motion of the moving parts 215, but small enough to restrict excessive movement. In some cases, the second gap 950 has a width 960 that is less than the thickness 450 of the moveable part 215 (FIG. 4). Consider the case when the thickness 450 of the moveable part 215 equals about 40 microns and the normal range of out-of-plane motion of the moveable part 215 relative to the non-moving parts (e.g., movement out of the plane of the fixed electrode 330 or walls 335 of the thin layer 220 depicted in FIGS. 2-3) equals about 2 microns or less. In such cases, some preferred embodiments of the second gap 950 have a width 960 in the range of about 2 to 10 microns.

Analogous to some embodiments of the spacer structure 410, attaching the integrated circuit 910 to the one side 212 can include forming a continuous bonding structure 920 between the integrated circuit 910 and the one side 212. For instance, the bonding structure 920 can include solder bonds configured to form a continuous solder dam that surrounds the moveable part 215 and thereby helps to seal-off the moveable part 215 from the external environment.

In the above example steps (FIGS. 2-9), the spacer structure 410 is shown as being formed on the MEM magnetometer 205 (step 120) before attaching the integrated circuit 910 to the MEM magnetometer 205 (step 115). In other embodiments, however, the integrated circuit 910 can be attached first (e.g., step 115) and then the spacer structure 410 is formed (step 120). Also, in the above example steps (FIGS. 2-9), because no magnet has yet to be attached to the moveable part 215, magnetically sensitive tools (e.g., tools containing ferromagnetic material, such as steel) can be used, and, a magnetically sensitive integrated circuit 910 (e.g., ICs containing ferromagnetic material) can be attached, without concern that the moveable part 215 will be damaged or moved out of its proper location.

Figure 10:
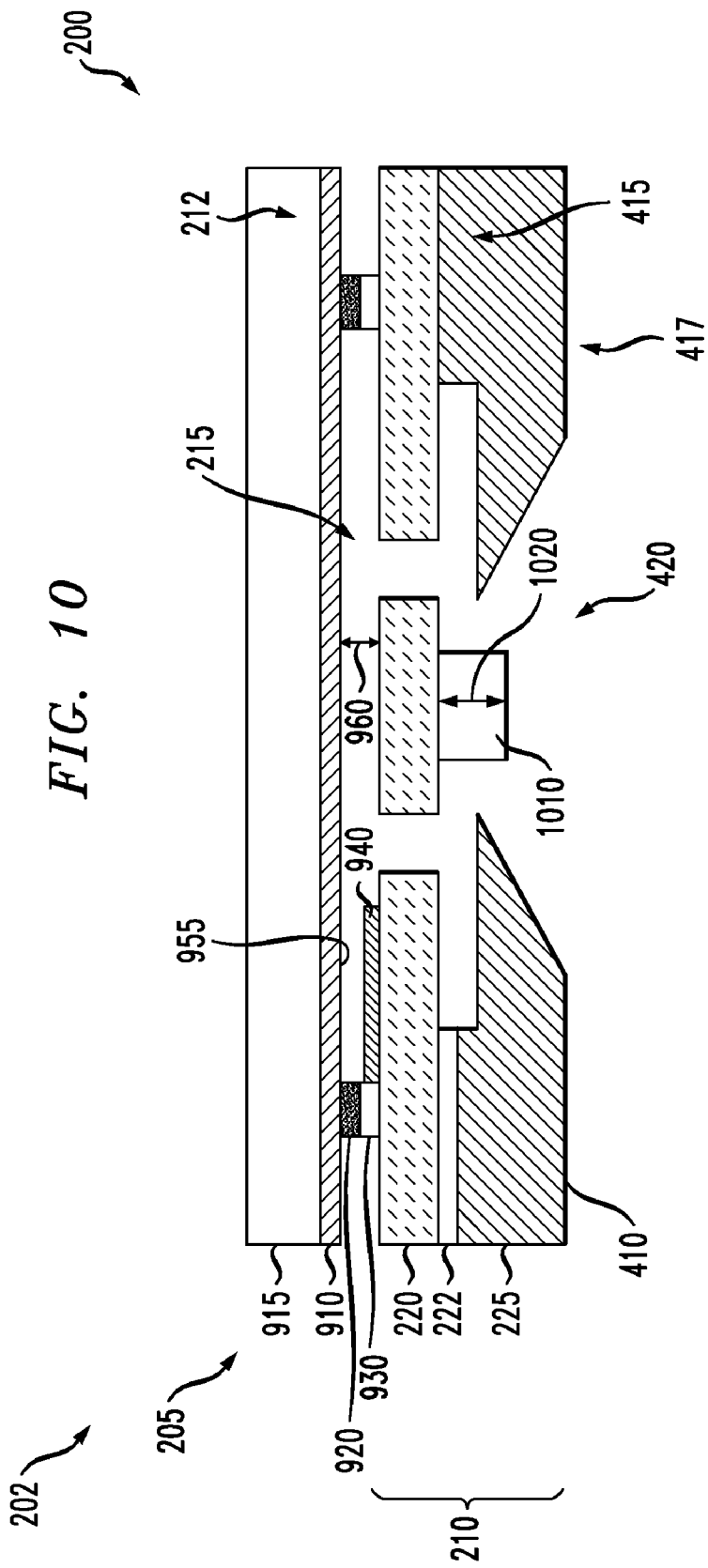
Figure 11:
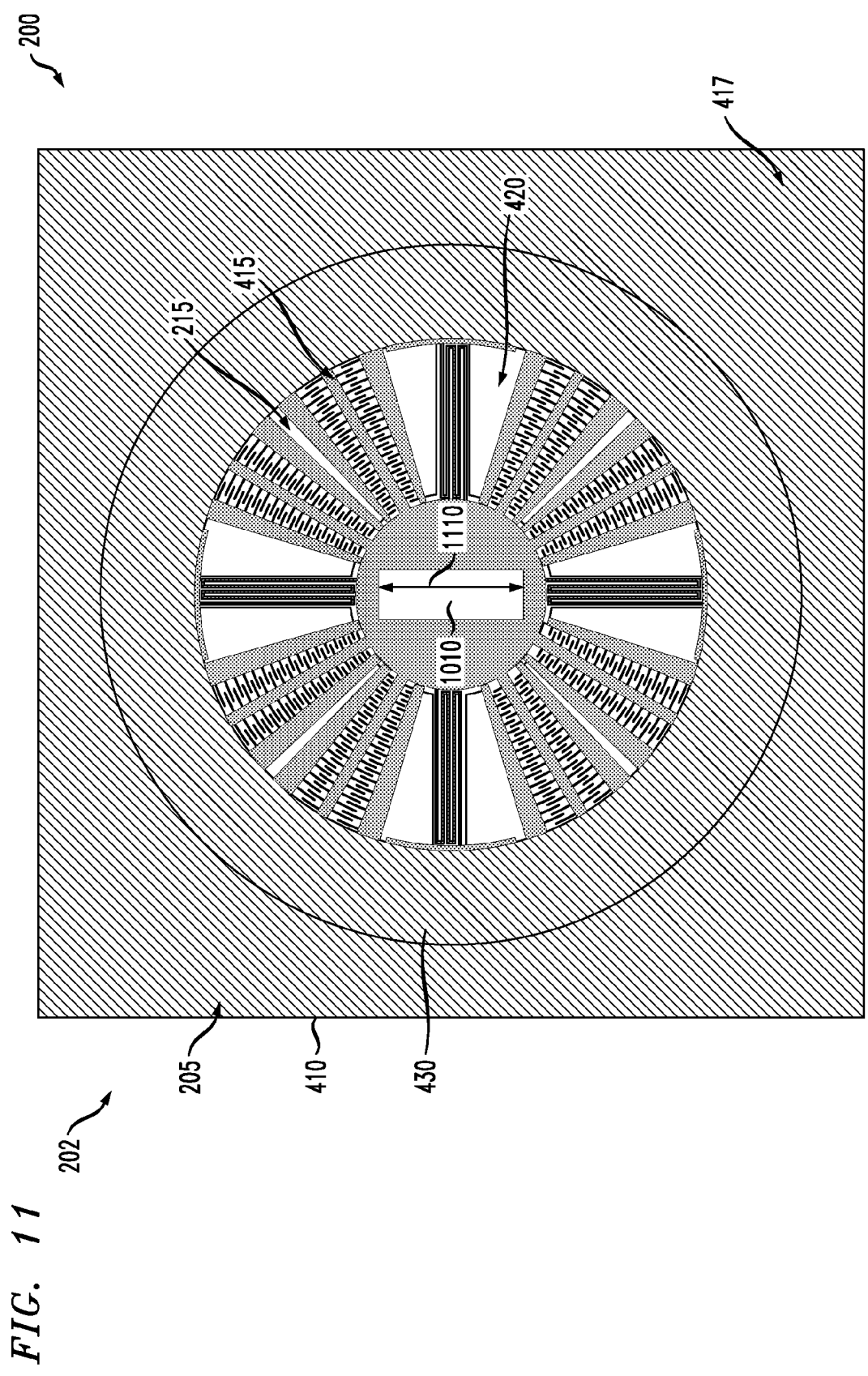

FIG. 10 illustrates a cross-sectional view, analogous to that shown in FIG. 9, of the partially-constructed apparatus 200 after mounting a permanent magnet 1010 in accordance with step 125 (FIG. 1B). FIG. 11 shows a plan view analogous to that shown in FIG. 5, of the partially-constructed apparatus 200 at the same stage of manufacture as FIG. 10. The magnet 1010 is mounted through the opening 420 of the spacer structure 410 to the movable part 215 in accordance with step 125. The magnet 1010 is mounted on the opposite side 415 of the MEM magnetometer that the integrated circuit 910 is mounted to (e.g., the side 212). In some embodiments, the mounting the magnet 1010 in step 125 includes covering the magnet 1010 with an adhesive and then contacting the magnet 1010 to the moveable part 215. For example the magnet 1010 can be dipped in glue, such as epoxy glue or other types of adhesive or cement, before being transported via a non-magnetic tool through the opening 420 to control the moveable part 215. The size of the opening 420 is carefully controlled to provide access to the moveable part 215. For example, in some preferred embodiments the circular opening 420 has a horizontal diameter 510 (FIG. 5) that is larger than a long axis 1110 of the magnet 1010 (FIG. 11), but smaller than the outer diameter 350 of the moving part 215 (FIG. 3).

An advantage in mounting the magnet on the opposite side 415 and through the opening 420 is that thicker magnets can be used than possible for magnets mounted to the same side 212 that the integrated circuit 910 is attached to. For example, in some embodiments, the magnet 1010 has a thickness 1020 of about 50 microns or greater. In some cases, thicker magnets are preferred because this is conducive to having a stronger magnetic field strength, and hence, providing an apparatus 200 this is more sensitive to the detection of magnetic field changes. Magnets 1010 of such thickness may not be mountable to the same side 212 that the integrated circuit 910 is attached to since the thick magnet 1010 obstructs the attachment of the integrated circuit 910. For example in some cases, the bonding structure 920 (e.g., solder bumps) between the MEM magnetometer 205 and the integrated circuit 910 cannot span the thickness 1020 of the magnet 1010.

Figure 12:
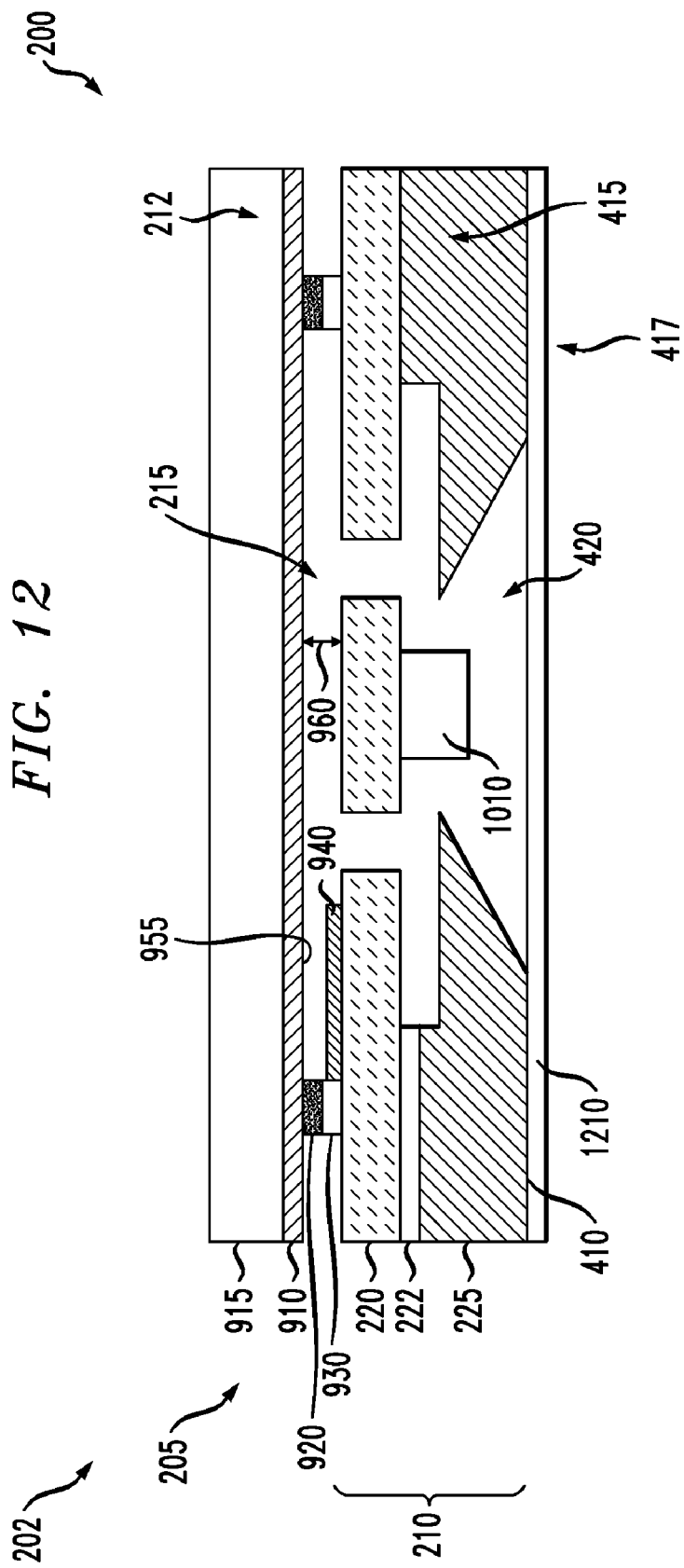

FIG. 12 illustrates a cross-sectional view, analogous to that shown in FIG. 10, of the partially-constructed apparatus 200 after covering the opening 420 of the spacer structure 410 with a lid 1210 in accordance with step 160 (FIG. 1B). The opening 420 can be covered with the lid 1210 after mounting the magnet 1010 through the opening 420. Covering the opening 420 with the lid 1210 can advantageously help to seal-off of the moveable part 215 from the external environment. In some cases it is desirable for the lid 1210 to be, or to include, a transparent window to facilitate visual inspection of the MEM magnetometer during its testing or operation.

Another embodiment of the disclosure is an apparatus. FIG. 12 presents a cross-sectional view of an example apparatus 200 of the disclosure. The apparatus 200 can be made by any of the embodiments of the method 100, and include any of the structures, described in the context of FIGS. 1-12.

For instance, the example apparatus 200 depicted in FIG. 12 comprises an integrated magnetometer package 202. The integrated magnetometer package 202 includes a MEM magnetometer 205 having a substrate 210 with a movable part 215 and an integrated circuit 910 attached to one side 212 of the MEM magnetometer substrate 210. The package 202 also includes a spacer structure 410 on an opposite side 415 of the MEM magnetometer substrate 210. The moveable part 215 is exposed through an opening 420 in the spacer structure 410 but the moveable part cannot escape through the opening 420. A permanent magnet 1010 is mounted to the movable part 215 on the opposite side 415 of the MEM magnetometer substrate 210.

As discussed above in the context of FIG. 3, embodiments of the moveable part 215 can have a substantially circular shape and comprise a plurality of springs 320 and comb capacitors electrodes 310 each attached to and projecting from a central hub 325 (FIG. 3). In some embodiments, a circular opening 420 of the spacer structure 410 has a horizontal diameter 510 (FIG. 5) that is less than the outer diameter 350 of the circularly-shaped moveable part 215 (FIG. 3), but greater than and greater than a long axis 1110 of the magnet 1010 (FIG. 11).

In some cases, the MEM magnetometer substrate 210 includes a thin silicon layer 220 of a SOI substrate (FIG. 2), and, the spacer structure 410 can comprise portions of a middle oxide layer 222 and a thick silicon layer 225 of the same SOI substrate 210 (FIG. 4). In other cases, the MEM magnetometer substrate 210 comprises a thin silicon layer 220 of a first SOI substrate, and the spacer structure 410 comprises a silicon layer 612 of a second SOI substrate 610 (FIG. 6).

Embodiments of the spacer structure 410 can include a support structure 425 than defines a gap 435 between the moveable part 215 and an opposing surface 440 of the support structure 410 (FIG. 4). The integrated circuit 910 can include a bonding structure 920 that define a second gap 950 between the moveable part 215 and an opposing surface 955 of the integrated circuit 910 (FIG. 9). As discussed in the context of FIGS. 4 and 9 one or both of the gap 435 and second gap 950 can have widths 445, 960 that are less than a thickness 450 of the moveable part 215.

In some embodiments, the moveable part 215 is isolated from an external environment surrounding the integrated magnetometer package 202 by a combination of structures. The support structure 425 of the spacer structure 410 can form a continuous seal between the opposite side 415 of the MEM magnetometer substrate 210 and the spacer structure 410 (FIGS. 4 and 5). The bonding structure 920 of the integrated circuit 910 can form a continuous seal between the one side 212 and the integrated circuit 910 (FIG. 9). A lid 1210 can cover the opening 420 of the spacer structure 410 (FIG. 11).

Although the present invention has been described in detail, those of ordinary skill in the art should understand that they can make various changes, substitutions and alterations herein without departing from the scope of the invention.

What is claimed is:

1. A method of manufacturing an apparatus, comprising, forming an integrated magnetometer package, including:
   forming a movable part from a MEM magnetometer substrate;
   attaching an integrated circuit to one side of said MEM magnetometer substrate;
   forming a structure on an opposite side of said MEM magnetometer substrate such that said moveable part is accessible through an opening in said structure said opening having an outer diameter that is smaller than an outer diameter of said moveable part such that said moveable part cannot escape from being between said integrated circuit and said MEM magnetometer substrate via said opening; and then
   mounting a permanent magnet through said opening to said movable part.

2. The method of claim 1, wherein forming said movable part includes performing a first etch on a first side of said MEM magnetometer substrate, and forming said structure includes performing a second etch of a second side of said MEM magnetometer substrate to form said opening.

3. The method of claim 1, wherein forming said movable part includes performing a first etch on a first side of said MEM magnetometer substrate and performing a second etch to remove one or more layers from a second side of said MEM magnetometer substrate, and, forming said structure includes etching a second substrate to form said structure and attaching said structure to said first side of said MEM magnetometer substrate.

4. The method of claim 1, wherein forming said structure include forming support structures that are configured to contact said opposite side of said MEM magnetometer substrate, said support structures defining a gap between said opposite side of said moveable part and an opposing surface of said support structure.

5. The method of claim 4, wherein said support structures form a continuous seal with said MEM magnetometer substrate, said continuous seal surrounding said moveable part.

6. The method of claim 1, wherein forming said structure includes forming said opening as a circular opening, wherein said opening has a horizontal diameter that is less than an outer diameter of said moveable part.

7. The method of claim 1, wherein forming said structure includes forming said opening as a circular opening, wherein said opening has a horizontal diameter that is greater than a long axis of said magnet.

8. The method of claim 1, wherein attaching said integrated circuit to said one side includes forming a bonding structure between said integrated circuit and said one side, wherein said bonding structure defines a gap between said one side and an opposing surface of said integrated circuit.

9. The method of claim 1, wherein forming said structure include forming a first gap between said opposite side and said structure, and attaching said integrated circuit includes forming a second gap between said one side and said integrated circuit, wherein both said first gap and said second gap have widths that are less than a thickness of said moveable part.

10. The method of claim 1, wherein attaching said integrated circuit to said one side includes forming a continuous seal between said integrated circuit and said one side.

11. The method of claim 1, wherein attaching said integrated circuit to said one side includes forming electrical connections between components of said integrated circuit and parts of said MEM magnetometer.

12. The method of claim 1, wherein mounting said magnet includes covering said magnet with an adhesive and then transferring said magnet through said opening to contact said moveable part on said one side.

13. The method of claim 1, further including covering said opening with a lid after mounting said magnet.

14. An apparatus, comprising:
an integrated magnetometer package, including:
a MEM magnetometer comprising a substrate with a movable part;
an integrated circuit attached to one side of said MEM magnetometer substrate;
a structure on an opposite side of said MEM magnetometer substrate configured such that said moveable part is accessible through an opening in said structure said opening having an outer diameter that is smaller than an outer diameter of said moveable part such that said moveable part cannot escape from being between said integrated circuit and said MEM magnetometer substrate via said opening; and
a permanent magnet mounted to said movable part on said opposite side of said MEM magnetometer substrate.

15. The apparatus of claim 14, wherein said MEM magnetometer substrate includes a thin silicon layer of a SOI substrate and said structure comprises a middle oxide layer and a thick silicon layer of said SOI substrate.

16. The apparatus of claim 14, wherein said MEM magnetometer substrate comprises a thin silicon layer of a first SOI substrate and said structure comprises a layer of a second SOI substrate.

17. The apparatus of claim 14, wherein said structure includes a support structure that defines a gap between said moveable part and an opposing surface of said support structure wherein said gap has a width that is less than a thickness of said moveable part.

18. The apparatus of claim 14, wherein said movable part has a circular shape with an outer diameter, and said opening is a circular opening with a horizontal diameter that is less than said outer diameter and greater than a long axis of said magnet.

19. The apparatus of claim 14, wherein said integrated circuit includes a bonding structure that defines a gap between said moveable part and an opposing surface of said integrated circuit, wherein said gap has a width that is less than a thickness of said moveable part.

20. The apparatus of claim 14, wherein said moveable part is isolated from an external environment surrounding said integrated magnetometer package by:
a support structure of said structure that forms a continuous seal between said opposite side and said structure,
a bonding structure of said integrated circuit that forms a continuous seal between said one side and said integrated circuit, and
a lid covering said opening.

* * * * *